United States Patent
Park et al.

(10) Patent No.: US 9,384,803 B2
(45) Date of Patent: Jul. 5, 2016

(54) STORAGE DEVICE AND LATCH MANAGEMENT METHOD THEREOF

(71) Applicant: Samsung Electronics Co., Ltd., Suwon-Si, Gyeonggi-Do (KR)

(72) Inventors: Sang-Soo Park, Hwaseong-si (KR); Moosung Kim, Yongin-si (KR); Taekyun Kang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/468,936

(22) Filed: Aug. 26, 2014

(65) Prior Publication Data

US 2015/0179238 A1 Jun. 25, 2015

(30) Foreign Application Priority Data

Dec. 20, 2013 (KR) .................. 10-2013-0160356

(51) Int. Cl.
*G11C 7/20* (2006.01)
*G11C 5/14* (2006.01)
*G11C 16/30* (2006.01)

(52) U.S. Cl.
CPC *G11C 7/20* (2013.01); *G11C 5/148* (2013.01); *G11C 16/30* (2013.01); *G11C 2207/2227* (2013.01)

(58) Field of Classification Search
USPC ...................... 365/185.12, 227, 229
See application file for complete search history.

(56) References Cited

U.S. PATENT DOCUMENTS

| | | |
|---|---|---|
| 6,278,636 B1 | 8/2001 | Lee |
| 6,580,645 B1 | 6/2003 | Lin et al. |
| 7,369,446 B2 | 5/2008 | Chan et al. |
| 7,453,725 B2 | 11/2008 | Chan et al. |
| 7,564,724 B2 | 7/2009 | Park |
| 8,134,395 B2 | 3/2012 | Sommer |
| 8,451,039 B2 | 5/2013 | Myers et al. |
| 8,539,272 B1 | 9/2013 | Yeung et al. |
| 2007/0247928 A1 | 10/2007 | Park |
| 2008/0056015 A1 | 3/2008 | Chan et al. |
| 2008/0084767 A1 | 4/2008 | Chan et al. |
| 2009/0154281 A1* | 6/2009 | Lee .............. G11C 5/14 365/227 |
| 2011/0025393 A1 | 2/2011 | Sommer |
| 2011/0051530 A1* | 3/2011 | Kushida .......... G11C 7/04 365/189.05 |
| 2012/0117311 A1* | 5/2012 | Hong ............. G06F 1/3275 711/103 |
| 2012/0201085 A1 | 8/2012 | Yoo et al. |
| 2012/0286850 A1 | 11/2012 | Myers et al. |

FOREIGN PATENT DOCUMENTS

| KR | 20070114522 A | 12/2007 |
|---|---|---|
| KR | 20090026496 A | 3/2009 |

* cited by examiner

*Primary Examiner* — Hoai V Ho
(74) *Attorney, Agent, or Firm* — Harness, Dickey & Pierce, P.L.C.

(57) ABSTRACT

A latch management method of a storage device includes permitting the storage device to enter a reduced power mode in which the storage device operates with a reduced power. The method includes reading initial latch data stored in the at least one nonvolatile memory device in response to the entering operation. The method includes setting latches associated with the at least one nonvolatile memory device based on the read initial latch data.

19 Claims, 12 Drawing Sheets

STORAGE DEVICE AND LATCH MANAGEMENT METHOD THEREOF

CROSS-REFERENCE TO RELATED APPLICATIONS

This U.S. non-provisional patent application claims priority under 35 U.S.C. §119 to Korean Patent Application No. 10-2013-160356 filed Dec. 20, 2013, the entire contents of which are hereby incorporated by reference.

BACKGROUND

Inventive concepts relate generally to storage devices and/or latch management methods thereof.

Semiconductor memory devices may be categorized into volatile semiconductor memory devices and nonvolatile semiconductor memory devices. Nonvolatile semiconductor memory devices may retain data stored therein even when the power of the device is off. Data stored in the nonvolatile semiconductor memory device may be permanent or reprogrammable, depending upon the fabrication technology used. Nonvolatile semiconductor memory devices may be used for user data, programming, and microcode storage in a wide variety of applications in the computer, avionics, telecommunications, and consumer electronics industries.

SUMMARY

According to at least one example embodiment, a latch management method of a storage device includes permitting the storage device to enter a reduced power mode in which the storage device operates with a reduced power. The method includes reading initial latch data stored in the at least one nonvolatile memory device in response to the storage device entering the reduced power mode. The method includes setting latches associated with the at least one nonvolatile memory device based on the read initial latch data.

According to at least one example embodiment, the method includes receiving a request for the reduced power mode from an external host before the storage device enters the reduced power mode.

According to at least one example embodiment, the method includes determining, without request from an external host, whether to enter the reduced power mode based on environment information.

According to at least one example embodiment, the method includes storing the initial latch data in the at least one nonvolatile memory device after a power-up operation of the storage device.

According to at least one example embodiment, the permitting includes receiving, by the at least one nonvolatile memory device, a command from the memory controller for the reduced power mode.

According to at least one example embodiment, the method includes reading data of a power-up flag cell of the at least one nonvolatile memory device after the storage device is powered on, the power-up flag cell storing data associated with a number of power-up operations of the storage device.

According to at least one example embodiment, the method includes determining whether to program the initial latch in the at least one nonvolatile memory device data based on the data read from the power-up flag cell.

According to at least one example embodiment, the method includes programming the initial latch data and data indicating that the number of power-up operations is at least 1 in the at least one nonvolatile memory device if the data read from the power-up flag cell indicates that the number of power-up operations is less than 1.

According to at least one example embodiment, the initial latch data is stored in the at least one nonvolatile memory device during manufacturing of the storage device.

According to at least one example embodiment, the latches are included in the memory controller.

According to at least one example embodiment, the latches are included in the at least one nonvolatile memory device.

According to at least one example embodiment, the latches are included in respective page buffers of the at least one nonvolatile memory device.

According to at least one example embodiment, a storage device includes at least one nonvolatile memory device including a plurality of latches and an area configured to store initial latch data, and a memory controller. The memory controller is configured to control the at least one nonvolatile memory device. The memory controller includes an initial latch setup unit configured to store the initial latch data for the plurality of latches in the area, and set the plurality of latches based on the initial latch data if the storage device enters a reduced power mode in which the storage device operates with a reduced power.

According to at least one example embodiment, the plurality of latches is included in respective page buffers of the at least one nonvolatile memory device, and the at least one nonvolatile memory device is configured to store data in the plurality of latches of each page buffer as the initial latch data after a power-up operation of the storage device.

According to at least one example embodiment, the at least one nonvolatile memory device further includes at least one power-up flag cell configured to store data associated with a number of power-up operations of the storage device.

According to at least one example embodiment, an electronic device includes a storage device including at least one nonvolatile memory device and a memory controller configured to control the at least one nonvolatile memory device, and a host configured to use data of the storage device. The storage device is configured to read initial data stored in the at least one nonvolatile memory device and set up logic circuits based on the initial data read if a request to enter a reduced power mode is received from the host. The reduced power mode is a mode in which the storage device operates with a reduced power.

According to at least one example embodiment, the storage device is configured to store the initial data in the at least one nonvolatile memory device after the storage device is powered up in a power-up operation. The initial data is data corresponding to data states of the logic circuits after the power-up operation.

According to at least one example embodiment, the initial data in the at least one nonvolatile memory device is stored by a manufacturer of the storage device.

According to at least one example embodiment, the host is an application processor.

According to at least one example embodiment, a nonvolatile memory device includes a memory cell array, an address decoder, a plurality of page buffers, and a control logic. The memory cell array includes memory blocks having a plurality of memory cells connected to word lines and bit lines. The address decoder is configured to select one of the memory blocks. The plurality of page buffers is connected to the bit lines and configured to temporarily store data to be stored in the memory cell array in a program operation or to read data from the memory cell array in a read operation. The control logic is configured to control the address decoder and the plurality of page buffers during the program operation or the read operation. Each of the plurality of page buffers includes a plurality of latches. The control logic is configured to set the plurality of latches with initial latch data if a command to enter a reduced power mode is received, the reduced power mode being a mode in which the nonvolatile memory device consumes a reduced power. The control logic is configured to store the initial latch data in one of the memory blocks as data for setting the plurality of latches at a power-up operation of the nonvolatile memory device.

According to at least one example embodiment, a method includes selecting data based on desired leakage current characteristics for a driving circuit of a memory device having the driving circuit. The method includes entering a reduced power mode in which the memory device operates with a reduced power. The method includes programming the selected data in logic circuits of the driving circuit in response to the entering operation.

According to at least one example embodiment, the method includes storing the selected data in the memory device, and reading the selected data stored in the memory device. The programming programs the selected data read from the memory device to the logic circuits.

According to at least one example embodiment, the storing operation occurs in response to a power-up operation of the memory device.

According to at least one example embodiment, the method includes reading flag data of a flag cell of the memory device after the memory device is powered on, the flag data being based on a number of power-up operations of the memory device.

According to at least one example embodiment, the method includes determining whether to perform the storing operation based on the flag data read from the flag cell.

According to at least one example embodiment, the method includes performing the storing operation if the flag data read from the flag cell indicates that the number of power-up operations is less than 1. The storing operation includes incrementing the flag data to indicate that the number of power-up operations has increased.

According to at least one example embodiment, the logic circuits are latches included in respective page buffers of the driving circuit, each page buffer being connected to a bit line of the memory device.

According to at least one example embodiment of inventive concepts, it is possible to reduce a leakage current by setting up latches using stored initial latch data at a sleep mode/reduced power mode.

BRIEF DESCRIPTION OF THE FIGURES

Example embodiments of inventive concepts are illustrated in the accompanying drawings. These example embodiments are presented as examples for teaching the making and use of inventive concepts.

DETAILED DESCRIPTION OF EXAMPLE EMBODIMENTS

Figure 1:
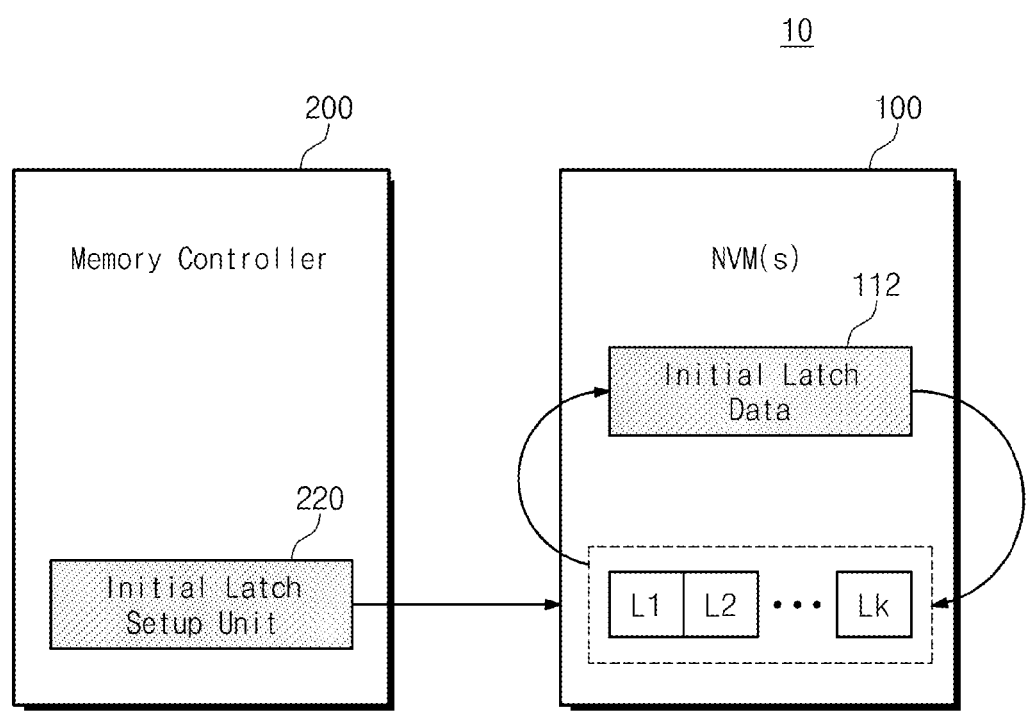
FIG. 1 is a diagram for conceptually describing a storage device according to inventive concepts.

Inventive concepts will now be described more fully with reference to the accompanying drawings, in which example embodiments of are shown. These example embodiments are provided so that this disclosure will be thorough and complete, and will fully convey inventive concepts of to those skilled in the art. Inventive concepts may be embodied in many different forms with a variety of modifications, and a few embodiments will be illustrated in drawings and explained in detail. However, this should not be construed as being limited to example embodiments set forth herein, and rather, it should be understood that changes may be made in these example embodiments without departing from the principles and spirit of inventive concepts, the scope of which are defined in the claims and their equivalents. Like numbers refer to like elements throughout. In the drawings, the thicknesses of layers and regions are exaggerated for clarity.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Specific details are provided in the following description to provide a thorough understanding of example embodiments. However, it will be understood by one of ordinary skill in the art that example embodiments may be practiced without these specific details. For example, systems may be shown in block diagrams so as not to obscure example embodiments in unnecessary detail. In other instances, well-known processes, structures and techniques may be shown without unnecessary detail in order to avoid obscuring example embodiments.

In the following description, illustrative embodiments will be described with reference to acts and symbolic representations of operations (e.g., in the form of flow charts, flow diagrams, data flow diagrams, structure diagrams, block diagrams, etc.) that may be implemented as program modules or functional processes include routines, programs, objects, components, data structures, etc., that perform particular tasks or implement particular abstract data types and may be implemented using existing hardware in existing electronic systems (e.g., electronic imaging systems, image processing systems, digital point-and-shoot cameras, personal digital assistants (PDAs), smartphones, tablet personal computers (PCs), laptop computers, etc.). Such existing hardware may include one or more Central Processing Units (CPUs), digital signal processors (DSPs), application-specific-integrated-circuits (ASICs), field programmable gate arrays (FPGAs) computers or the like.

Although a flow chart may describe the operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, function, procedure, subroutine, subprogram, etc. When a process corresponds to a function, its termination may correspond to a return of the function to the calling function or the main function.

As disclosed herein, the term "storage medium", "computer readable storage medium" or "non-transitory computer readable storage medium" may represent one or more devices for storing data, including read only memory (ROM), random access memory (RAM), magnetic RAM, core memory, magnetic disk storage mediums, optical storage mediums, flash memory devices and/or other tangible or non-transitory machine readable mediums for storing information. The term "computer-readable medium" may include, but is not limited to, portable or fixed storage devices, optical storage devices, and various other tangible or non-transitory mediums capable of storing, containing or carrying instruction(s) and/or data.

Furthermore, example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a computer readable storage medium. When implemented in software, a processor or processors may be programmed to perform the necessary tasks, thereby being transformed into special purpose processor(s) or computer(s).

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "includes", "including", "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "and/or" includes any and all combinations of one or more of the associated listed items. Expressions such as "at least one of," when preceding a list of elements, modify the entire list of elements and do not modify the individual elements of the list.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

When entering a specific mode, a storage device according to at least one example embodiment of inventive concepts may set latches with previously stored initial latch data to reduce leakage currents of the latches.

FIG. 1 is a diagram for conceptually describing concept storage device according to at least one example embodiment of inventive concepts. Referring to FIG. 1, a storage device 10 includes at least one nonvolatile memory device 100 and a memory controller 200 to control the at least one nonvolatile memory device 100.

A nonvolatile memory device 100 may be a NAND flash memory, a vertical NAND flash memory (VNAND), a NOR flash memory, a resistive RAM (RRAM), a phase-change RAM (PRAM), a magnetoresistive RAM (MRAM), an STT- RAM (Spin Transfer Torque Random Access Memory), etc. Also, the nonvolatile memory device may be implemented to have a three-dimensional array structure. Inventive concepts are applicable to not only a flash memory device where a charge storage layer is formed of a floating gate, but also a charge trap flash (CTF) memory where a charge storage layer is formed of an insulation film. Below, it is assumed that a nonvolatile memory device is a vertical NAND flash memory device.

The nonvolatile memory device 100 includes a plurality of latches L1 to Lk (k being an integer of 2 or more).

The memory controller 200 includes an initial latch setup unit 220 that may set up the latches L1 to Lk of the nonvolatile memory device 100 with data.

When the storage device 10 enters (or is permitted to enter) a specific mode (e.g., a sleep mode or a reduced power mode in which the storage device 10 operations with a reduced power), the initial latch setup unit 220 may set up the latches L1 to Lk using initial latch data stored in the nonvolatile memory device 100. Here, the initial latch data may be stored in a specific area 112 of the nonvolatile memory device 100. In FIG. 1, an example is illustrated in which initial latch data is stored in the nonvolatile memory device 100. However, inventive concepts are not limited thereto. For example, the initial latch data may be stored in a nonvolatile memory device different from the nonvolatile memory device 100.

In at least one example embodiment, the initial latch setup unit 220 may store data in the latches L1 to Lk as initial latch data at the same time with power-up of the storage device 10.

In at least one example embodiment, the initial latch setup unit 220 may store data in the latches L1 to Lk as initial latch data in response to a request of the storage device 10.

In at least one example embodiment, the initial latch data has a value stored by a manufacturer of the nonvolatile memory device 100.

A typical storage device includes a nonvolatile memory device having latches for driving memory cells. If a bit line pitch decreases, the size of a latch of a driving circuit decreases. As the size of latch further decreases, however, a standby current also increases.

In contrast, the storage device 10 according to at least one example embodiment of inventive concepts may store initial latch data for reducing (or alternatively, minimizing) a leakage current and may set up the latches L1 to Lk using the initial latch data. Thus, it is possible to reduce a standby current of a driving circuit.

Further, latches of inventive concepts may be internal components of a page buffer of a nonvolatile memory device.

Figure 2:
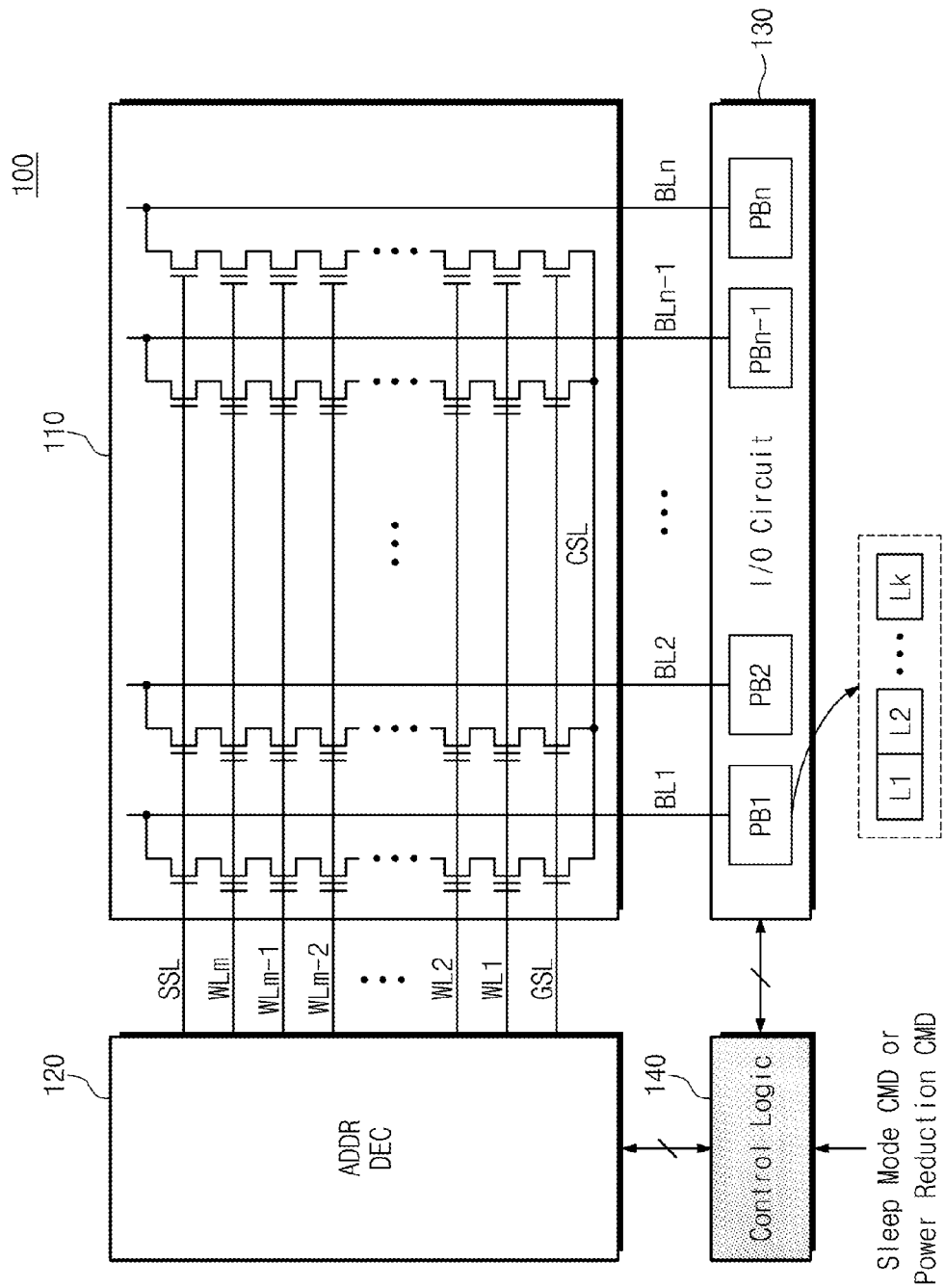
FIG. 2 is a block diagram schematically illustrating a nonvolatile memory device shown in FIG. 1, according to at least one example embodiment of inventive concepts.

FIG. 2 is a block diagram schematically illustrating a nonvolatile memory device 100 shown in FIG. 1, according to at least one example embodiment of inventive concepts. Referring to FIG. 2, a nonvolatile memory device 100 includes a memory cell array 110, an address decoder 120, an input/output circuit (or driving circuit) 130, and a control logic 140.

The memory cell array 110 is connected to the address decoder 120 through word lines WL1 to WLm (m being an integer of 2 or more), at least one string selection line SSL, and at least one ground selection line GSL. The memory cell array 110 is connected to the input/output circuit 130 through bit lines BL1 to BLn (n being an integer of 2 or more). The memory cell array 110 includes a plurality of memory blocks BLK1 to BLKz (not shown). FIG. 2 shows only one memory block.

The memory block, as illustrated in FIG. 2, includes a plurality of strings. Here, each string may include at least one string selection transistor, a plurality of memory cells, and at least one ground selection transistor stacked on a substrate. Each memory cell may store at least one data bit. In at least one example embodiment, at least one dummy cell may be included between the at least one string selection transistor and the memory cells. In at least one other example embodiment, at least one dummy cell may be included between the memory cells and the at least one ground selection transistor.

The address decoder 120 selects one of the memory blocks based on an input address. The address decoder 120 is connected to the selected memory block through the word lines WL1 to WLm, the at least one string selection line SSL and the at least one ground selection line GSL. The address decoder 120 selects the word lines WL1 to WLm, the string selection line SSL and the ground selection line GSL using a decoded row address. Also, the address decoder 120 decodes a column address of the input address ADDR. The decoded column address DCA is provided to the input/output circuit 130. In at least one example embodiment, the address decoder 120 may include a row decoder, a column decoder, an address buffer, and so on.

The input/output circuit 130 is connected to the memory cell array 110 through the bit lines BL1 to BLn. The input/output circuit 130 selects the bit lines using the decoded column address DCA.

The input/output circuit 130 includes a plurality of page buffers PB1 to PBn. The page buffers PB1 to PBn are configured to have the ABL (all bit line) structure. However, inventive concepts are not limited thereto. For example, the page buffers PB1 to PBn may be configured to have an even-odd bit line structure.

The page buffers PB1 to PBn receive data from an external host (e.g., a memory controller 200 shown in FIG. 1) and store the received data in the memory cell array 110. The page buffers PB1 to PBn read data from the memory cell array 110 to output it to the external host.

As illustrated in FIG. 2, each of the page buffers PB1 to PBn includes a plurality of latches L1 to Lk. Here, the latches L1 to Lk are divided into sense, cache, and data latches according to functions.

The control logic 140 controls an overall operation of the nonvolatile memory device 100 including a program operation, a read operation, an erase operation, etc. The control logic 140 operates in response to control signals or command provided from the external host.

Also, the control logic 140 may store, as initial latch data, data latched in the latches L1 to Lk of each page buffer in a desired (or alternatively, predetermined) area 112 (refer to FIG. 1) in response to a power-up operation or an external request. Here, at power-up, data latched in the latches L1 to Lk may be the most stable data (or, data causing the least leakage current). The initial latch data stored in latches L1 to Lk may be selected based on empirical evidence. For example, the initial latch data may be selected such that desired leakage current characteristics are met. The initial latch data may be automatically selected by the storage device 10 and/or selected by a user. Here, the desired (or alternatively, predetermined) area 112, although not shown in FIG. 2, is one of the memory blocks.

The control logic 140 reads initial latch data in response to an external request and may set up the latches L1 to Lk of each page buffer based on the initial latch data read. For example, when receiving a sleep mode command or a power reduction command (or, a low-power mode command), the control logic 140 reads initial latch data and may set up the latches L1 to Lk of each page buffer based on the initial latch data read.

The nonvolatile memory device 100 according to at least one example embodiment of inventive concepts may reduce a standby current by setting up the latches L1 to Lk of each page buffer based on the initial latch data read.

Figure 3:
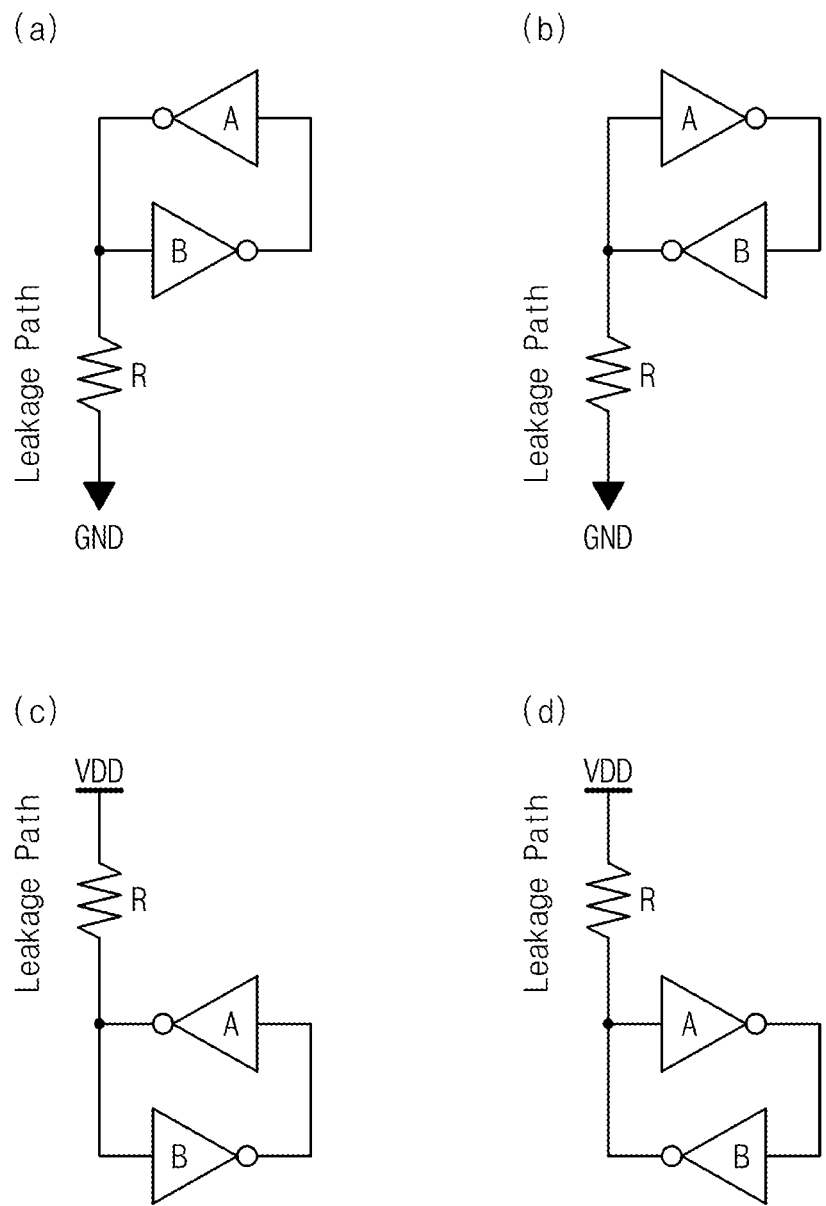
FIG. 3 is a diagram schematically illustrating leakage current paths of latches according to at least one example embodiment of inventive concepts.

FIG. 3 is a diagram schematically illustrating leakage current paths of latches according to at least one example embodiment of inventive concepts. For ease of description, it is assumed that a latch is formed of inverters A and B connected as illustrated in FIG. 3. However, example embodiments are not limited thereto.

Four cases (a) to (d) are shown in FIG. 3. Referring to the first case (a), a leakage current path R is formed between an input terminal of a second inverter B and a ground terminal GND. Referring to the second case (b), a leakage current path R is formed between an output terminal of the second inverter B and the ground terminal GND. Referring to the third case (c), a leakage current path R is formed between an output terminal of a first inverter A and a power supply voltage terminal VDD. Referring to the fourth case (d), a leakage current path R is formed between an input terminal of the first inverter A and the power supply voltage terminal VDD.

A nonvolatile memory device 100 (refer to FIG. 2) according to at least one example embodiment of inventive concepts detects leakage current paths shown in FIG. 3 and may set up latches with initial latch data for reducing (or alternatively, minimizing) a leakage current.

Figure 4:
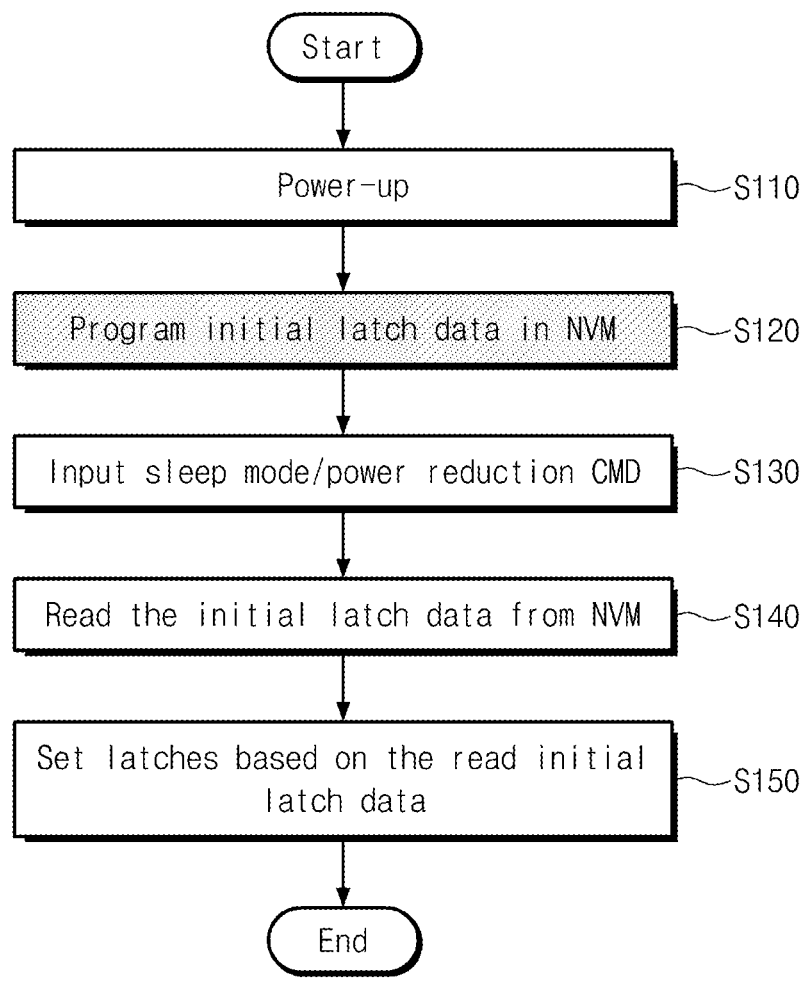
FIG. 4 is a flow chart schematically illustrating a latch management method of a nonvolatile memory device according to at least one example embodiment of inventive concepts.

FIG. 4 is a flow chart schematically illustrating a latch management method of a nonvolatile memory device according to at least one example embodiment of inventive concepts. A latch management method of a nonvolatile memory device is described with reference to FIG. 4.

In operation S110, at a power-up operation of a storage device 10 (refer to FIG. 1), a power is supplied to a nonvolatile memory device 100. In operation S120, the nonvolatile memory device 100 programs data stored in latches L1 to Lk of each page buffer in a desired (or alternatively, predetermined) area as initial latch data. Although not explicitly shown, operation S120 may include selecting the initial latch data to be programmed based on desired leakage current characteristics of the storage device 10. This selection may be based on empirical evidence and/or user input. In operation S130, a sleep mode command or power reduction command is provided from a memory controller 200 (refer to FIG. 1) of the storage device 10 to the nonvolatile memory device 100. In operation S140, the nonvolatile memory device 100 reads the initial latch data stored in the desired (or alternatively, predetermined) area in response to the sleep mode command or power reduction command. Afterwards, in operation S150, the nonvolatile memory device 100 may set up (or program) the latches L1 to Lk of each page buffer based on the initial latch data read in operation S140. For example, the nonvolatile memory device 100 may program the initial latch data read in operation S140 to the latches L1 to Lk.

If desired, the latch management method according to at least one example embodiment of inventive concepts utilizes initial latch data stored at power-up to set up the latches L1 to Lk.

FIG. 4 describes an example in which initial latch data is stored at every power-up operation. However, inventive concepts are not limited thereto. For example, after initial latch data is stored at an initial power-up operation, that data may be continuously used for future power-up operations.

Figure 5:
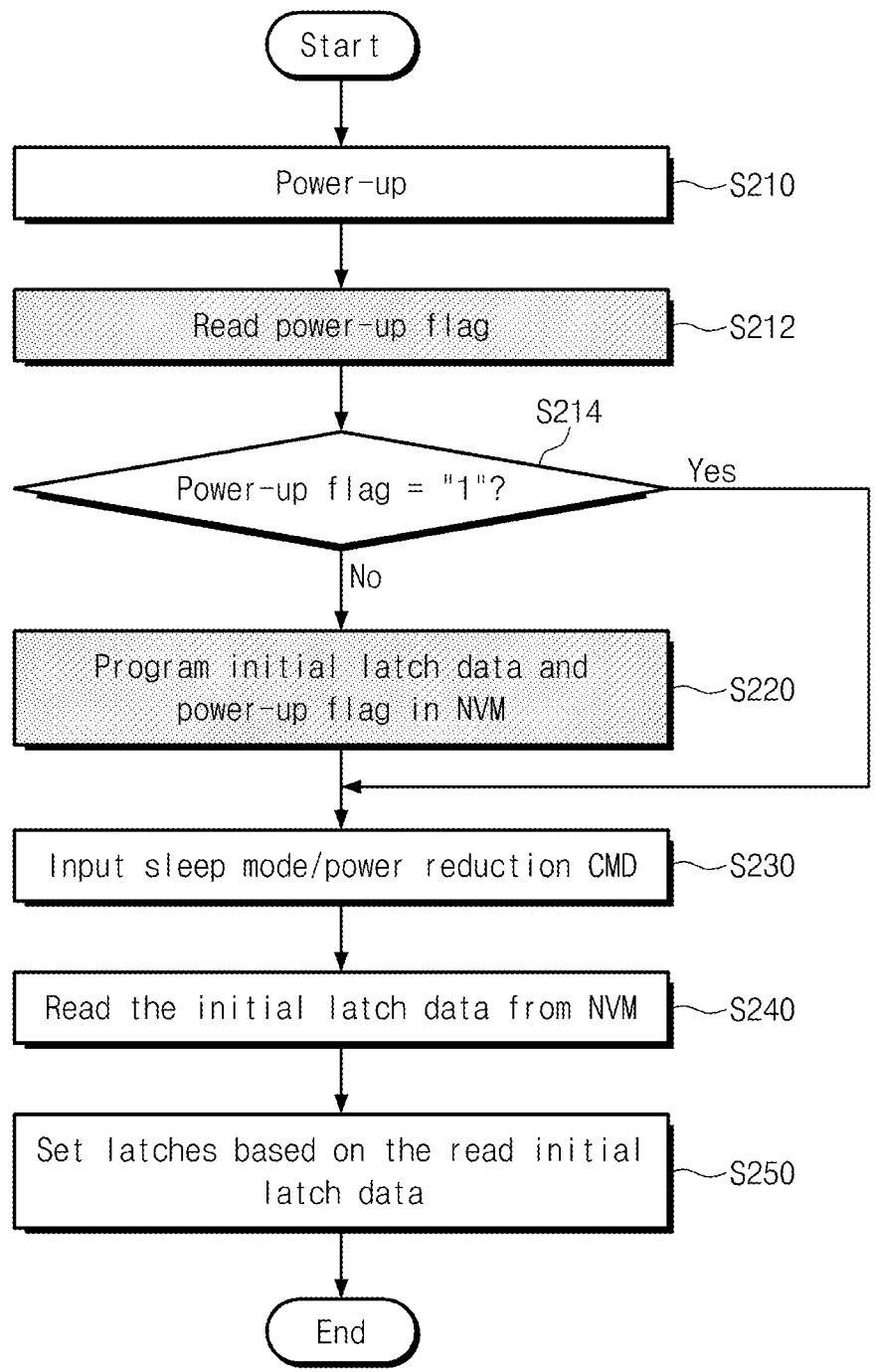
FIG. 5 is a flow chart schematically illustrating a latch management method of a nonvolatile memory device according to at least one example embodiment of inventive concepts.

FIG. 5 is a flow chart schematically illustrating a latch management method of a nonvolatile memory device according to at least one example embodiment of inventive concepts. A latch management method of a nonvolatile memory device is described with reference to FIG. 5.

At a power-up operation of a storage device 10 (refer to FIG. 1), in operation S210, a power is supplied to a nonvolatile memory device 100 (refer to FIG. 1). In operation S212, the nonvolatile memory device 100 reads at least one power-up flag cell. Here, the power-up flag cell may store data associated with a number of power-up operations. In operation S214, the nonvolatile memory device 100 determines whether data stored in the power-up flag cell indicates that the number of power-up operations is greater than or equal to "1".

If data stored in the power-up flag cell indicates that the number of power-up operations is not (or less than) "1", in operation S220, the nonvolatile memory device 100 programs data stored in latches L1 to Lk of each page buffer at a desired (or alternatively, predetermined) area as initial latch data and simultaneously programs data of "1" at the power-up flag cell. In at least one example embodiment, an area where the initial latch data is stored may be equal to an area (e.g., the same page or the same memory block) where the power-up flag cell is included. In at least one other example embodiment, an area where the initial latch data is stored may be different from an area where the power-up flag cell is included. For example, the power-up flag cell may be included in a memory device different from the nonvolatile memory device 100.

If data stored in the power-up flag cell indicates that the number of power-up operations is "1", the method proceeds to operation S230.

In operation S230, a sleep mode command or power reduction command is provided from a memory controller 200 (refer to FIG. 1) of the storage device 10 to the nonvolatile memory device 100. In operation S240, the nonvolatile memory device 100 reads the initial latch data stored in the desired (or alternatively, predetermined) area in response to the sleep mode command or power reduction command. Afterwards, in operation S250, the nonvolatile memory device 100 may set up the latches L1 to Lk of each page buffer based on the initial latch data read in operation S240.

The nonvolatile memory device 100 of inventive concepts may erase the power-up flag cell at a specific time point in response to a request of the memory controller 200, such that data of the power-up flag cell has a value not indicating "1".

If desired, the latch management method according to at least one example embodiment of inventive concepts utilizes initial latch data stored at power-up to set up the latches L1 to Lk.

FIGS. 4 and 5 describe an example in which data stored in latches at power-up is used as initial latch data. However, inventive concepts are not limited thereto. For example, initial latch data may be data that is decided by a manufacturer of a nonvolatile memory device.

Figure 6:
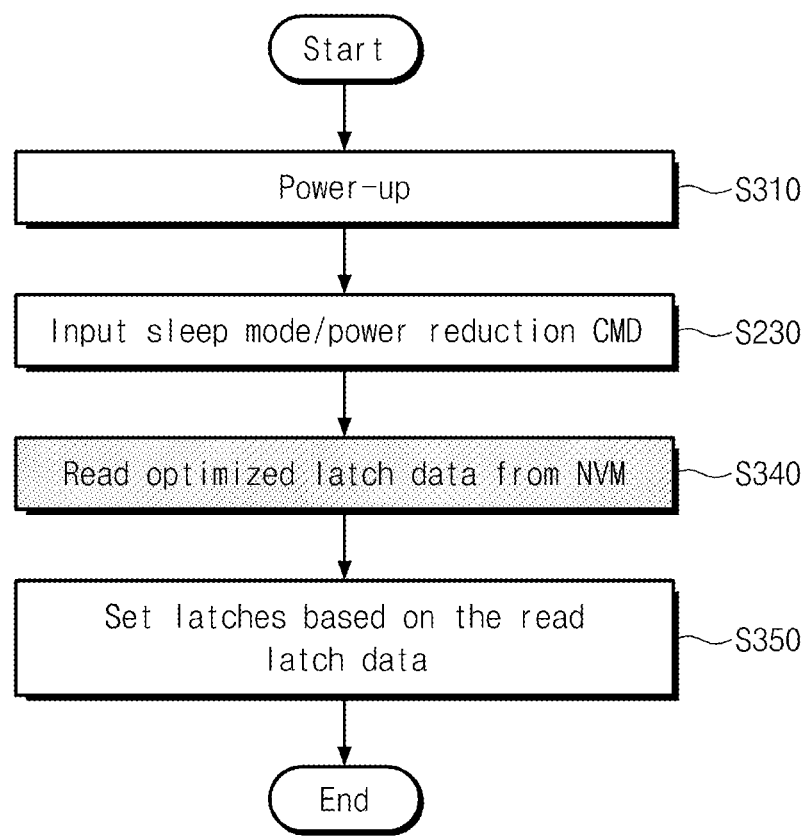
FIG. 6 is a flow chart schematically illustrating a latch management method of a nonvolatile memory device according to at least one example embodiment of inventive concepts.

FIG. 6 is a flow chart schematically illustrating a latch management method of a nonvolatile memory device according to at least one example embodiment of inventive concepts. A latch management method of a nonvolatile memory device is described with reference to FIG. 6.

In operation S310, at power-up operation of a storage device 10 (refer to FIG. 1), a power is supplied to a nonvolatile memory device 100. In operation S230, a sleep mode command or power reduction command is provided from a memory controller 200 (refer to FIG. 1) of the storage device 10 to the nonvolatile memory device 100. In operation S340, the nonvolatile memory device 100 reads initial latch data stored in a desired (or alternatively, predetermined) area in response to the sleep mode command or power reduction command. Here, the initial latch data may be data that is stored at the desired (or alternatively, predetermined) area by a manufacturer of the nonvolatile memory device 100. Afterwards, in operation S350, the nonvolatile memory device 100 may set up the latches L1 to Lk of each page buffer based on the initial latch data read in operation S340.

If desired, the latch management method according to at least one example embodiment of inventive concepts utilizes initial latch data stored by a manufacturer to set up latches L1 to Lk.

FIGS. 1 to 6 describe examples where there is reduced leakage currents of latches L1 to Lk included in the nonvolatile memory device 100. However, the inventive concepts are not limited thereto. For example, inventive concepts are applicable to a latch management method capable of reducing leakage currents of latches L1 to Lk included in a memory controller.

Figure 7:
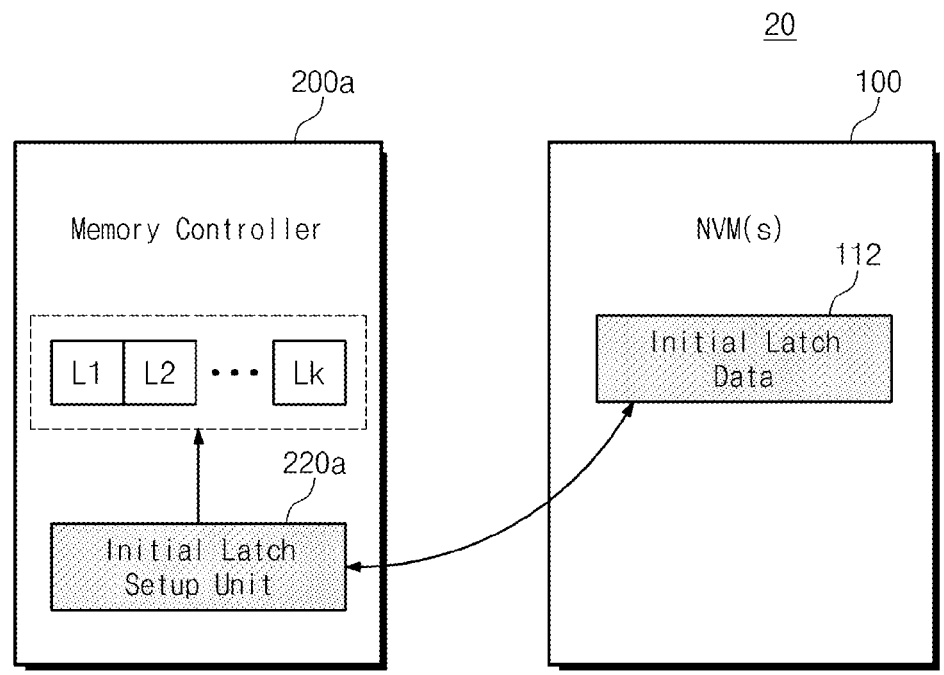
FIG. 7 is a block diagram schematically illustrating a storage device according to at least one example embodiment of inventive concepts.

FIG. 7 is a block diagram schematically illustrating a storage device 20 according to at least one example embodiment of inventive concepts. Referring to FIG. 7, a storage device 20 includes at least one nonvolatile memory device 100 and a memory controller 200a to control the at least one nonvolatile memory device 100. The nonvolatile memory device 100 includes a desired (or alternatively, predetermined) area 112 for storing initial latch data. At a specific mode, the memory controller 200a includes an initial latch setup unit 220a that may set up latches L1 to Lk of the memory controller 220a using initial latch data stored in the desired (or alternatively, predetermined) area. Here, the initial latch data is data stored by a manufacturer or data stored by the memory controller 200a when the storage device 20 enters the specific mode.

The storage device 20 according to at least one example embodiment of inventive concepts uses initial latch data stored in the nonvolatile memory device 100 to set up latches L1 to Lk in the memory controller 200a.

Inventive concepts may perform a latch management operation for reducing a leakage current in response to an external request (e.g., a sleep mode, a reduced power mode, and the like).

Figure 8:
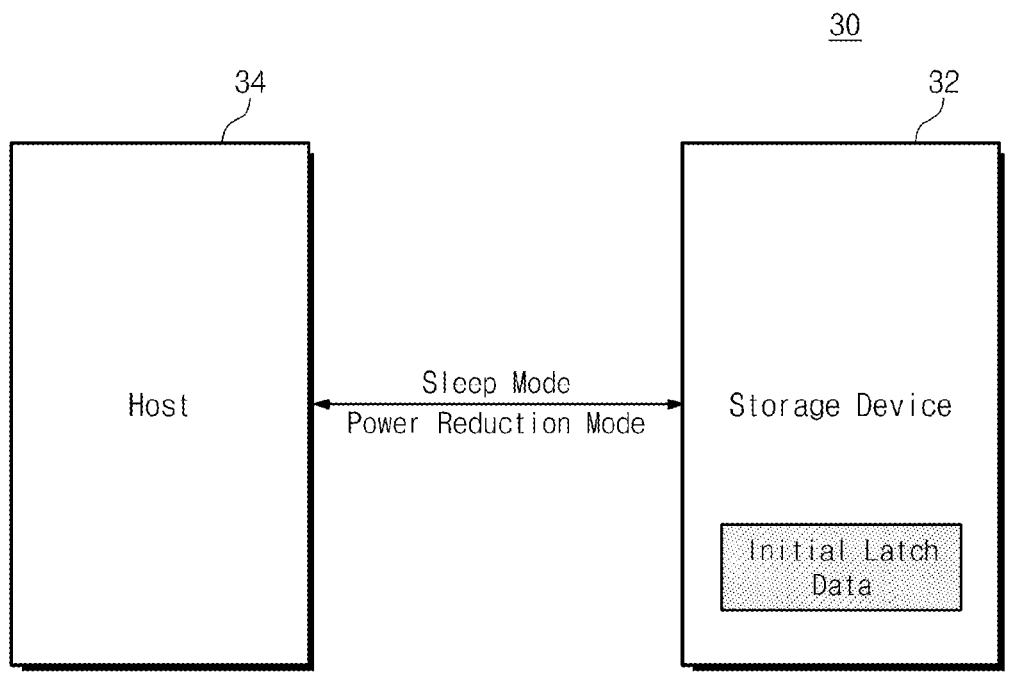
FIG. 8 is a block diagram schematically illustrating an electronic device according to at least one example embodiment of inventive concepts.

FIG. 8 is a block diagram schematically illustrating an electronic device 30 according to at least one example embodiment of inventive concepts. Referring to FIG. 8, an electronic device 30 includes a storage device 32 and a host 34 using data stored in the storage device 32. If desired, the host 34 requests entering of the storage device 32 into a sleep mode or a reduced power mode (or, a low-power mode). The storage device 32 may perform an initial latch management operation described with reference to FIGS. 1 to 7, based on a request indicating that the storage device 32 should enter a sleep mode or a reduced power mode. That is, latches are set up using initial latch data stored in the nonvolatile memory device 100 to reduce a leakage current.

The electronic device 30 according to at least one example embodiment of inventive concepts may perform a latch management operation for reducing a leakage current according to a request indicating an entry into a specific mode (e.g., a low-power mode).

Although not shown figures, a latch management operation for reducing a leakage current may be performed based on an internal hardware/software/firmware request of the storage device 32, without a request of a host 34. The internal request of the storage device 32 may be based on environment information. Environment information may include information about a usage state of the storage device 32.

Figure 9:
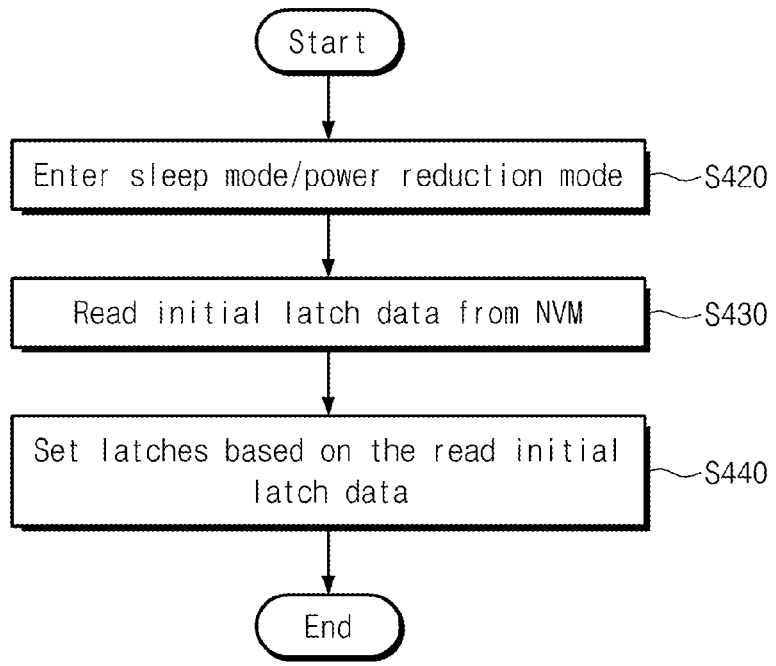
FIG. 9 is a flow chart schematically illustrating a latch management method of an electronic device according to at least one example embodiment of inventive concepts.

FIG. 9 is a flow chart schematically illustrating a latch management method of an electronic device according to at least one example embodiment of inventive concepts. A latch management method of an electronic device is described with reference to FIGS. 8 and 9.

Information indicating an entry into a sleep mode or reduced power mode is provided from a host 34 to a storage device 32. In operation S420, the storage device 32 enters the sleep mode or the reduced power mode in response to the received information. In operation S430, the storage device 32 reads initial latch data stored in an internal nonvolatile memory device. In operation S440, latches of the storage device 32 are set up based on the initial latch data read in operation S430.

The electronic device 30 according to an embodiment of the inventive concept may set up latches using initial latch data when entering the sleep mode or the reduced power mode.

In FIGS. 1 to 9, there is described a latch management method for reducing a leakage current. However, inventive concepts are not limited thereto. For example, inventive concepts are applicable to other logic circuits that generate leakage currents.

Figure 10:
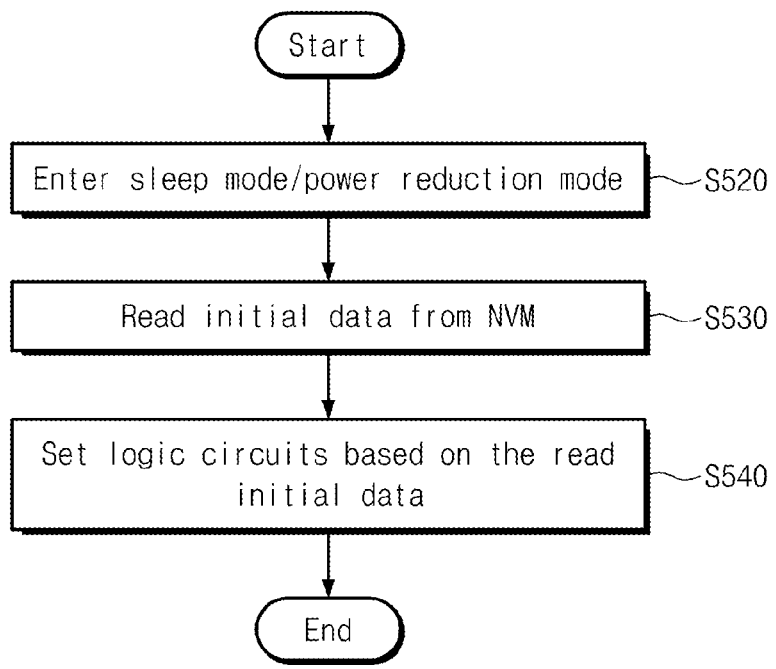
FIG. 10 is a flow chart schematically illustrating a logic circuit management method of an electronic device according to at least one example embodiment of inventive concepts.

FIG. 10 is a flow chart schematically illustrating a logic circuit management method of an electronic device according to at least one example embodiment of inventive concepts. Below, a logic circuit management method of an electronic device is described.

In operation S520, an electronic device enters a sleep mode or the reduced power mode. In operation S530, the electronic device reads initial data stored in a nonvolatile memory device included in the electronic device. Here, the initial data is data for setting up a logic circuit to reduce a leakage current. In operation S540, the initial data read in operation S530 is used to set up logic circuits in the electronic device.

When entering a sleep mode/power reduction mode, the electronic device according to at least one example embodiment of inventive concepts may set up logic circuits using initial data such that a leakage current is reduced.

It should also be understood that inventive concepts are applicable to VNAND devices.

Figure 11:
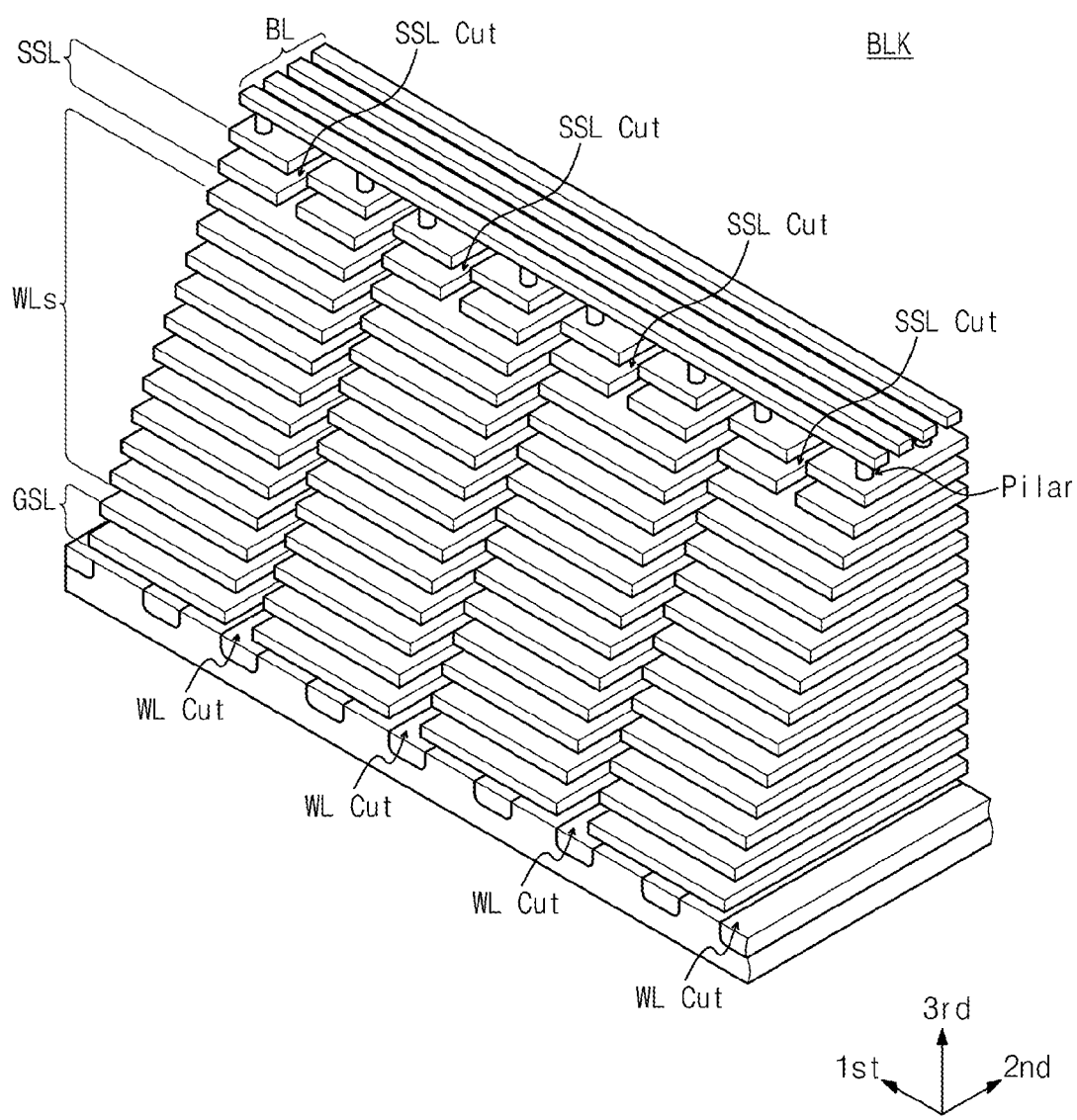
FIG. 11 is a perspective view of a memory block of a VNAND according to at least one example embodiment of inventive concepts.

FIG. 11 is a perspective view of a memory block BLK of a VNAND according to at least one example embodiment of inventive concepts. Referring to FIG. 11, four sub blocks are formed on a substrate. Each sub block is formed by stacking at least one ground selection line GSL, a plurality of word lines, and at least one string selection line SSL on the substrate and between word line cuts in a plate shape. Here, the at least one string selection line SSL is separated by string selection line cuts.

In at least one example embodiment, at least one plate-shaped dummy line is stacked between the ground selection line GSL and the word lines. Alternatively, at least one plate-shaped dummy line is stacked between the word lines and the string selection line SSL.

Although not shown in FIG. 11, each word line cut may include a common source line CSL. In at least one example embodiment, the common source lines CSL included in the word line cuts may be interconnected. A string may be formed by making a pillar connected to a bit line penetrate the at least one string selection line SSL, the word lines, and the at least one ground selection line GSL.

FIG. 11 illustrates an example embodiment in which a structure between word line cuts is a sub block. However, inventive concepts are not limited thereto. For example, a structure between a word line cut and a string selection line cut may be defined as a sub block.

The memory block BLK according to at least one example embodiment of inventive concepts may be implemented to have a merged word line structure where two word lines are merged into one word line.

It should further be understood that inventive concepts are applicable to a solid state drive (SSD).

Figure 12:
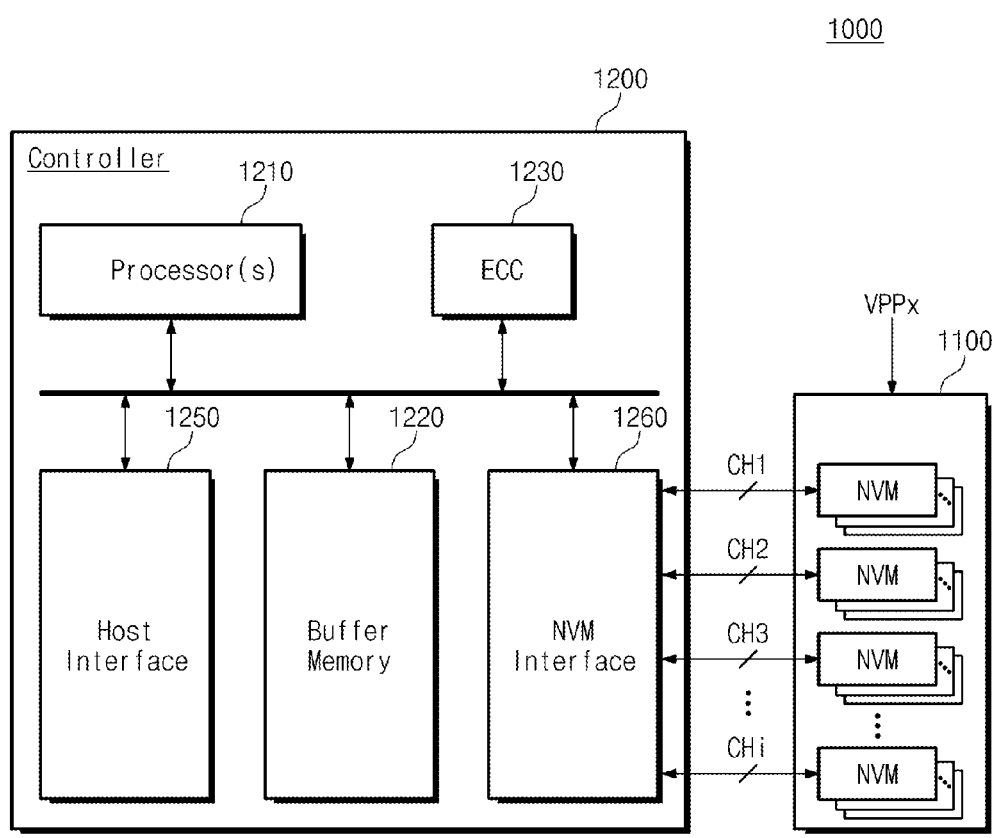
FIG. 12 is a block diagram schematically illustrating a solid state drive according to at least one example embodiment of inventive concepts.

FIG. 12 is a block diagram schematically illustrating a solid state drive according to at least one example embodiment of inventive concepts. Referring to FIG. 12, a solid state drive (hereinafter, referred to as SSD) 1000 includes a plurality of nonvolatile memory devices 1100 and an SSD controller 1200.

The nonvolatile memory devices 1100 are implemented to be optionally provided with an external high voltage VPPx. Each of the nonvolatile memory devices 1100 is implemented to manage latches using initial latch data as described with reference to FIGS. 1 to 10. The SSD controller 1200 is connected to the nonvolatile memory devices 1100 through a plurality of channels CH1 to CHi (i being an integer of 2 or more). The SSD controller 1200 includes one or more processors 1210, a buffer memory 1220, an error correction code (ECC) block 1230, a host interface 1250, and a nonvolatile memory interface 1260.

The buffer memory 1220 may stores data needed to drive the SSD controller 1200. In at least one example embodiment, the buffer memory 1220 may include a plurality of memory lines each storing data or a command. Here, the plurality of memory lines may be mapped onto cache lines according to various methods.

The ECC block 1230 calculates error correction code values of data to be programmed at a writing operation and corrects an error of read data using an error correction code value in a read operation. In a data recovery operation, the ECC block 1230 may correct an error of data recovered from the nonvolatile memory devices 1100. Although not shown in FIG. 14, a code memory may be further included to store code data needed to drive the SSD controller 1200. The code memory may be implemented with a nonvolatile memory device.

The host interface 1250 provides an interface with an external host. The host interface 1250 may be a NAND flash interface. The nonvolatile memory interface 1260 provides an interface with the nonvolatile memory devices 1100.

The SSD 1000 according to at least one example embodiment of inventive concepts may reduce a leakage current at a specific mode (e.g., a reduced power mode) by managing latches using initial latch data.

It should be further understood that inventive concepts are applicable to an eMMC (e.g., an embedded multimedia card, moviNAND, iNAND, etc.).

Figure 13:
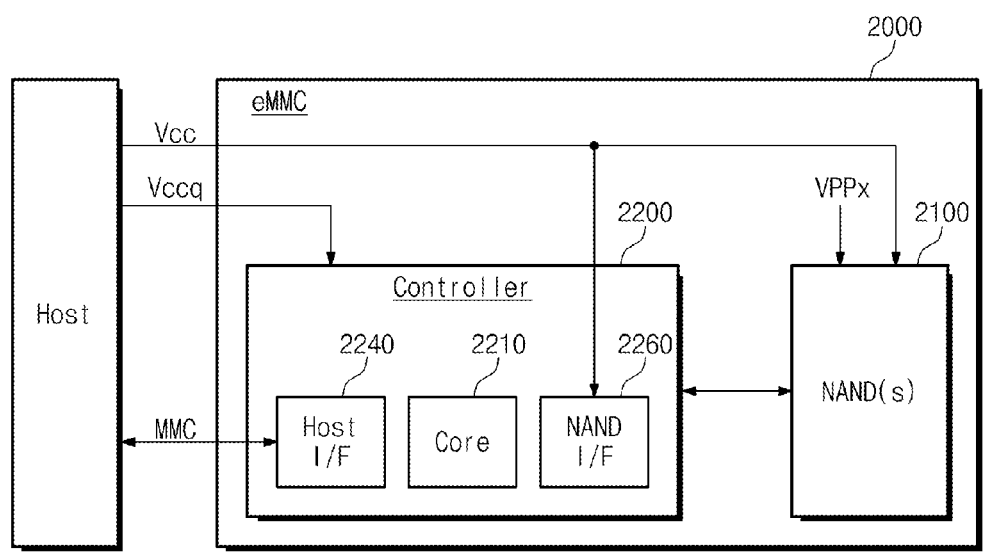
FIG. 13 is a block diagram schematically illustrating an eMMC according to at least one example embodiment of inventive concepts.

FIG. 13 is a block diagram schematically illustrating an eMMC according to at least one example embodiment of inventive concepts. Referring to FIG. 13, an eMMC 2000 includes one or more NAND flash memory devices 2100 and a controller 2200.

The NAND flash memory device 2100 is a single data rate (SDR) NAND flash memory device or a double data rate (DDR) NAND flash memory device. The NAND flash memory device 2100 may store initial latch data. The controller 2200 is connected to the NAND flash memory device 2100 via a plurality of channels. The memory controller 2200 manages latches based on initial latch data, as described with reference to FIGS. 1 to 10.

The controller 2200 includes one or more controller cores 2210, a host interface 2250, and a NAND interface 2260. The controller core 2210 may control an overall operation of the eMMC 2000. The host interface 2250 is configured to serve as an interface between the controller 2210 and a host. The NAND interface 2260 is configured to provide an interface between the NAND flash memory device 2100 and the controller 2200. In at least one example embodiment, the host interface 2250 may be a parallel interface (e.g., an MMC interface). In at least one other example embodiment, the host interface 2250 of the eMMC 2000 may be a serial interface (e.g., UHS-II, UFS, etc.).

The eMMC 2000 receives power supply voltages Vcc and Vccq from the host. Herein, the power supply voltage Vcc (e.g., about 3.3 V) may be supplied to the NAND flash memory device 2100 and the NAND interface 2260, and the power supply voltage Vccq (e.g., about 1.8 V to 3.3 V) may be supplied to the controller 2200. In at least one example embodiment, the eMMC 2000 may be optionally supplied with an external high voltage.

In at least one example embodiment, the eMMC 2000 includes a wireless communication (e.g., WiPi) function.

As the eMMC 2000 according to at least one example embodiment inventive concepts reduces (or alternatively, minimizes) a leakage current flowing to latches using initial latch data at a sleep mode/low-power mode, a mobile device is improved (or alternatively, optimized).

It should further be understood that inventive concepts are applicable to universal flash storage (UFS).

Figure 14:
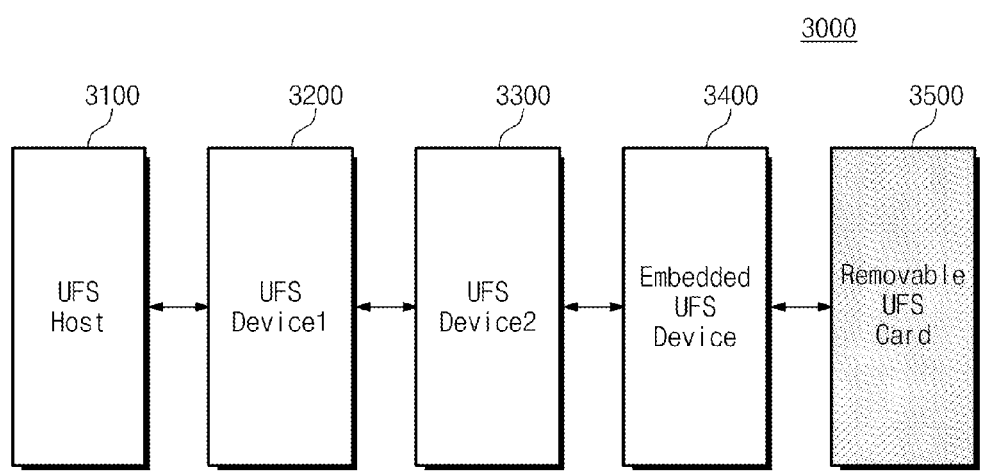
FIG. 14 is a block diagram schematically illustrating a UFS system according to at least one example embodiment of inventive concepts.

FIG. 14 is a block diagram schematically illustrating a UFS system according to at least one example embodiment of inventive concepts. Referring to FIG. 14, a UFS system 3000 includes a UFS host 3100, UFS devices 3200 and 3300, an embedded UFS device 3400, and a removable UFS card 3500. The UFS host 3100 may be an application processor of a mobile device. Each of the UFS host 3100, the UFS devices 3200 and 3300, the embedded UFS device 3400, and the removable UFS card 3500 may communicate with external hosts through the UFS protocol. At least one of the UFS devices 3200 and 3300, the embedded UFS device 3400, and the removable UFS card 3500 may be implemented with a storage device 10 shown in FIG. 1 or a storage device 20 shown in FIG. 7.

Meanwhile, the embedded UFS device 3400 and the removable UFS card 3500 may perform communications using protocols different from the UFS protocol. The UFS host 3100 and the removable UFS card 3500 may communicate through various card protocols (e.g., UFDs, MMC, SD (secure digital), mini SD, Micro SD, etc.).

It should be understood that inventive concepts are applicable to a mobile device.

Figure 15:
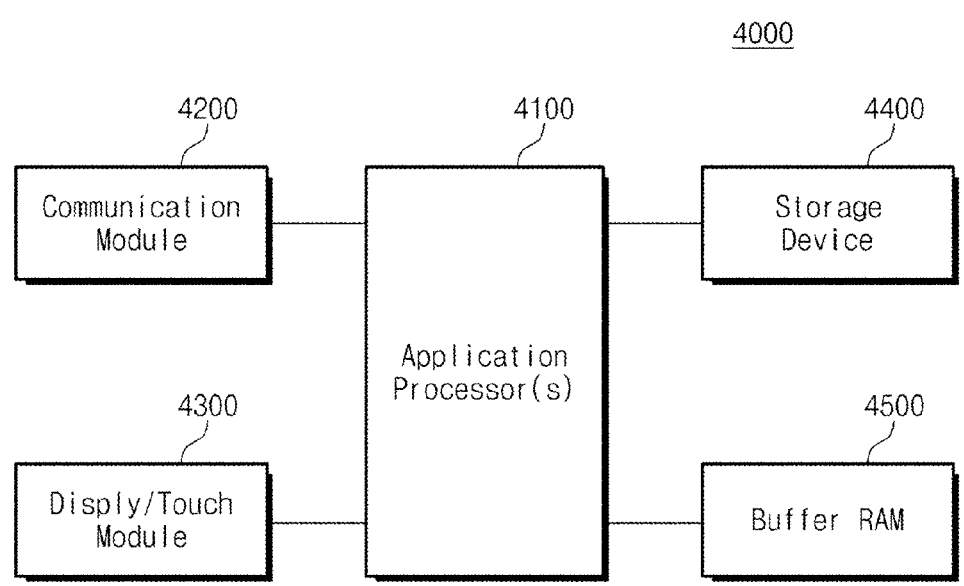
FIG. 15 is a block diagram schematically illustrating a mobile device according to at least one example embodiment of inventive concepts.

FIG. 15 is a block diagram schematically illustrating a mobile device 4000 according to at least one example embodiment of inventive concepts. Referring to FIG. 15, a mobile device 4000 includes an application processor 4100, a communication module 4200, a display/touch module 4300, a storage device 4400, and a buffer RAM 4500.

The application processor 4100 controls an overall operation of the mobile device 4000. The communication module 4200 is implemented to perform wireless or wired communications with an external host. The display/touch module 4300 is implemented to display data processed by the application processor 4100 or to receive data through a touch panel. The storage device 4400 is implemented to store user data. As described with reference to FIGS. 1 to 10, the storage device 4400 may be configured to manage latches using initial latch data to reduce a leakage current at a specific mode (e.g., a reduced power mode) or to manage logic circuits using initial data. The buffer RAM 4500 is configured to temporarily store data needed for a processing operation of the mobile device 4000.

The mobile device 4000 according to at least one example embodiment of inventive concepts includes the storage device 4400, which manages latches and logic circuits to reduce a leakage current. Thus, it is possible to improve system performance.

A memory system and/or a storage device according to inventive concepts may be packaged according to any of a variety of different packaging technologies. Examples of such packaging technologies may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline Integrated Circuit (SOIC), Shrink Small Outline Package (SSOP), Thin Small Outline Package (TSOP), Thin Quad Flatpack Package (TQFP), System In Package (SIP), Multi Chip Package (MCP), Wafer-level Fabricated Package (WFP), Wafer-Level Processed Stack Package (WSP), and the like.

While inventive concepts have been described with reference to example embodiments, it will be apparent to those skilled in the art that various changes and modifications may be made without departing from the spirit and scope of inventive concepts. Therefore, it should be understood that the above example embodiments are not limiting, but illustrative.

What is claimed is:

1. A latch management method of a storage device including at least one nonvolatile memory device and a memory controller configured to control the at least one nonvolatile memory device, the method comprising:
    permitting the storage device to enter a reduced power mode in which the storage device operates with a reduced power;
    reading initial latch data stored in the at least one nonvolatile memory device if the storage device enters the reduced power mode, the initial latch data being data for reducing leakage current of the storage device during the reduced power mode; and
    setting latches associated with the at least one nonvolatile memory device based on the read initial latch data.

2. The latch management method of claim 1, further comprising:
    receiving a request for the reduced power mode from an external host before the storage device enters the reduced power mode.

3. The latch management method of claim 1, further comprising:
    determining, without request from an external host, whether to enter the reduced power mode based on environment information.

4. The latch management method of claim 1, further comprising:
    storing the initial latch data in the at least one nonvolatile memory device after a power-up operation of the storage device.

5. The latch management method of claim 4, wherein the permitting includes receiving, by the at least one nonvolatile memory device, a command from the memory controller for the reduced power mode.

6. A latch management method of a storage device including at least one nonvolatile memory device and a memory controller configured to control the at least one nonvolatile memory device, the method comprising:
    reading data of a power-up flag cell of the at least one nonvolatile memory device after the storage device is powered on, the power-up flag cell storing data associated with a number of power-up operations of the storage device;
    permitting the storage device to enter a reduced power mode in which the storage device operates with a reduced power;
    reading initial latch data stored in the at least one nonvolatile memory device if the storage device enters the reduced power mode;
    setting latches associated with the at least one nonvolatile memory device based on the read initial latch data.

7. The latch management method of claim 6, further comprising:
    determining whether to program the initial latch data in the at least one nonvolatile memory device data based on the data read from the power-up flag cell.

8. The latch management method of claim 7, further comprising:
    programming the initial latch data and data indicating that the number of power-up operations is at least 1 in the at least one nonvolatile memory device if the data read from the power-up flag cell indicates that the number of power-up operations is less than 1.

9. The latch management method of claim 1, wherein the initial latch data is stored in the at least one nonvolatile memory device during manufacturing of the storage device.

10. The latch management method of claim 1, wherein the latches are included in the memory controller.

11. The latch management method of claim 1, wherein the latches are included in the at least one nonvolatile memory device.

12. The latch management method of claim 11, wherein the latches are included in respective page buffers of the at least one nonvolatile memory device.

13. A method comprising:
    selecting data based on desired leakage current characteristics for a driving circuit of a memory device having the driving circuit;
    entering a reduced power mode in which the memory device operates with a reduced power;
    reading data of a power-up flag cell of the memory device after the memory device is powered on, the power-up flag cell storing data associated with a number of power-up operations of the memory device; and
    programming the selected data in logic circuits of the driving circuit in response to the entering operation.

14. The method of claim 13, further comprising:
    storing the selected data in the memory device; and
    reading the selected data stored in the memory device, wherein the programming programs the selected data read from the memory device to the logic circuits.

15. The method of claim 14, wherein the storing operation occurs in response to a power-up operation of the memory device.

16. The method of claim 13, further comprising:
    determining whether to perform the storing operation based on the flag data read from the flag cell.

17. The method of claim 16, further comprising:
    performing the storing operation if the flag data read from the flag cell indicates that the number of power-up operations is less than 1, wherein the storing operation includes incrementing the flag data to indicate that the number of power-up operations has increased.

18. The method of claim 14, wherein the logic circuits are latches included in respective page buffers of the driving circuit, each page buffer being connected to a bit line of the memory device.

19. The latch management method of claim 1, wherein the latches belong to page buffers of a driving circuit configured to drive memory cells of the at least one nonvolatile memory device, the page buffers being connected to bit lines of the at least one nonvolatile memory device.

* * * * *